(12) United States Patent
Okuda et al.

(10) Patent No.: US 6,720,735 B2
(45) Date of Patent: Apr. 13, 2004

(54) ORGANIC EL ELEMENT AND METHOD OF MAKING THE SAME

(75) Inventors: Yoshiyuki Okuda, Tsurugashima (JP); Masami Tsuchida, Tsurugashima (JP); Satoshi Miyaguchi, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/987,363

(22) Filed: Nov. 14, 2001

(65) Prior Publication Data

US 2002/0125830 A1 Sep. 12, 2002

(30) Foreign Application Priority Data

Nov. 15, 2000 (JP) .................................. 2000-347996

(51) Int. Cl.[7] .............................................. G09G 3/10
(52) U.S. Cl. ..................................... 315/169.3; 313/506
(58) Field of Search ......................... 315/169.3, 169.1; 313/506, 505, 498, 502

(56) References Cited

U.S. PATENT DOCUMENTS

| | | | | |
|---|---|---|---|---|
| 4,731,610 A | * | 3/1988 | Baron et al. | 345/91 |
| 5,216,331 A | * | 6/1993 | Hosokawa et al. | 315/169.3 |
| 5,828,181 A | * | 10/1998 | Okuda | 315/169.3 |
| 6,107,734 A | * | 8/2000 | Tanaka et al. | 313/506 |
| 6,169,291 B1 | * | 1/2001 | Metzger et al. | 257/40 |
| 6,274,979 B1 | * | 8/2001 | Celii et al. | 313/506 |

* cited by examiner

*Primary Examiner*—Don Wong
*Assistant Examiner*—Thuy Vinh Tran
(74) *Attorney, Agent, or Firm*—Sughrue Mion, PLLC

(57) ABSTRACT

The present invention relates to an organic EL light emitting element that can suppress deterioration of a light emitting layer and can provide a high light-emission intensity. This organic EL light emitting element includes a light emitting part and a rectifier part connected in series to the light emitting part. Both of the light emitting and rectifier parts include organic thin layers. The electrostatic capacity of the rectifier part is smaller than that of the light emitting part.

13 Claims, 14 Drawing Sheets

ORGANIC EL ELEMENT AND METHOD OF MAKING THE SAME

BACKGROUND OF THE INVENTION

1. Field of the Invention

The present invention relates to an organic electroluminescence (referred to as "EL" hereinafter) element which serves as a light emitting element.

2. Description of the Related Art

A typical conventional organic EL panel includes a pair of electrode groups and an organic multi-layer body sandwiched between the electrode groups. Each electrode group has a plurality of parallel electrodes arranged like stripes, and the electrodes of the two electrode groups extend perpendicularly relative to each other. The organic multi-layer body includes a plurality of thin layers or films, and at least one of the thin layers is a light emitting layer. The light emitting layer emits a light to display an image when a voltage is applied between the electrode groups.

A so-called simple matrix drive scheme successively scans one of the electrode groups, i.e., either an anode (positive pole) electrode group or a cathode (negative pole) electrode group, while applying a signal voltage to the other electrode group. As a result, desired picture elements (pixels) among those located at intersecting points of the positive and negative pole electrodes radiate and display an image.

Since the simple matrix drive scheme successively displays the image line by line, each of the picture elements is allowed to emit a light for a very short period in a single frame. In order to obtain an image having desired brightness (clarity), therefore, each of the light emitting picture elements should emit a light with a strong instantaneous brightness. If the instantaneous brightness should be increased, a voltage applied to the EL element should be raised during light emission. As a result, a consumption electric power increases. Further, the thin organic films in the light emitting layer may be damaged by heat.

SUMMARY OF THE INVENTION

The present invention is directed to an organic EL element suited for use in an organic EL panel, and an object of the present invention is to provide an organic EL element that can emit a light at high-intensity but does not deteriorate light emitting layers greatly. Another object of the present invention is to provide a method of fabricating such an organic EL element.

According to one aspect of the present invention, there is provided an organic EL element including a light emitting portion having an organic thin film and a rectifier portion connected in series to the light emitting portion, wherein the rectifier portion also has an organic thin film, and an electrostatic capacity of the rectifier portion is smaller than that of the light emitting portion.

According to another aspect of the present invention, there is provided a method of making an organic EL element including the steps of forming first and second electrodes independently, forming an organic thin layer diode on the first electrode, forming a lead electrode over the whole of the organic thin layer diode and over at least part of the second electrode, and forming an organic electroluminescence single- or multi-layer body over the second electrode and lead electrode, the organic electroluminescence body including at least one organic electroluminescence light emitting layer.

DETAILED DESCRIPTION OF THE INVENTION

Embodiments of the present invention will be described in reference to the accompanying drawings.

Figure 1:
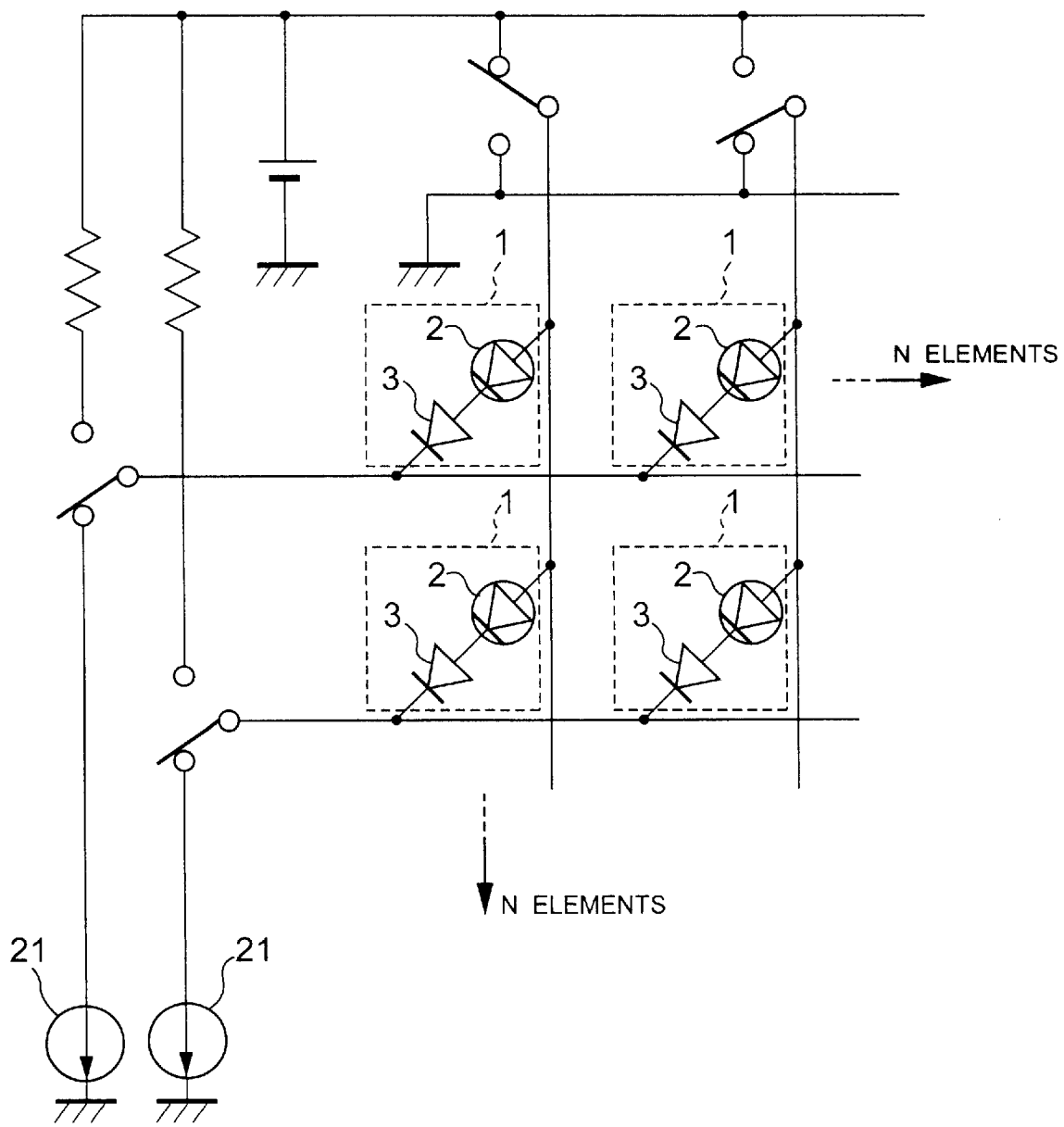
FIG. 1 illustrates an electric circuit diagram of an organic EL panel equipped with organic EL elements according to the present invention.

Referring to FIG. 1, illustrated is an organic EL panel having a plurality of organic EL elements 1 according to the present invention. The organic EL elements 1 are light emitting elements and provided N×N. It should be noted that only four among the N×N light emitting elements 1 are shown in FIG. 1. The organic EL elements 1 are arranged like a matrix. Accordingly, each scanning line includes N elements, and the organic EL panel includes N scanning lines. Each of the organic EL elements 1 has a light emitting portion 2 and a rectifier portion 3 connected in series to the light emitting portion 2.

Figure 2:
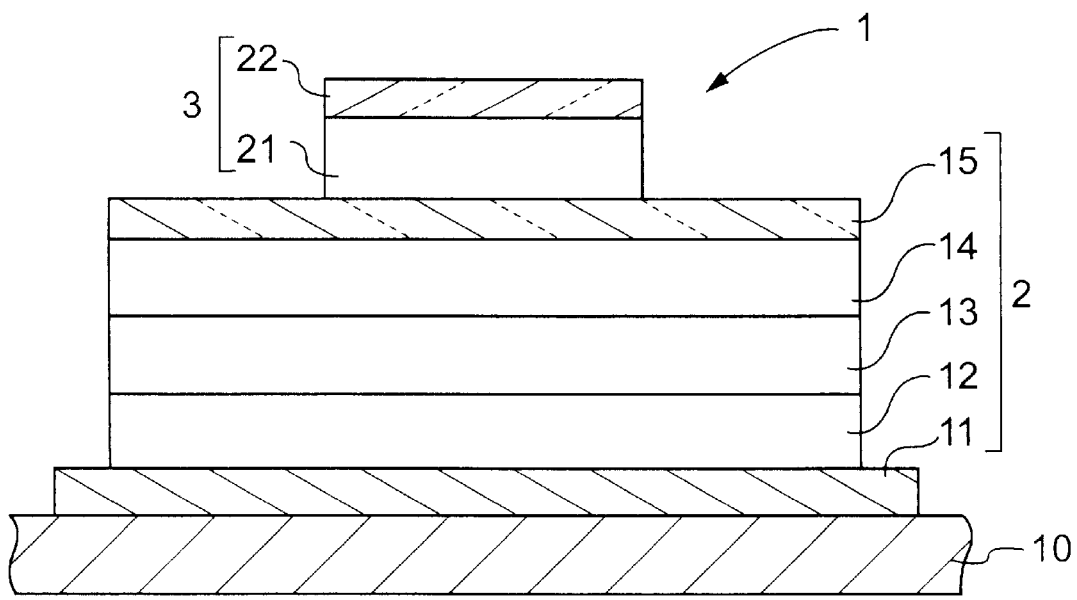
FIG. 2 illustrates a cross sectional view of the organic EL element shown in FIG. 1.

Referring to FIG. 2, the light emitting portion 2 of the light emitting element 1 is formed on a glass substrate 10, and the rectifier portion 3 is formed on the light emitting portion 2. The light emitting portion 2 includes five layers 11 to 15, and the rectifier portion 3 includes two layers 21 and 22. The light emitting portion 2 is made integral with the rectifier portion 3. Thus, the light emitting element 1 has a multi-layer one-piece structure. Specifically, the light emitting portion 2 has a transparent electrode 11 such as ITO formed on the glass substrate 10. A hole transport layer 12 made from CuPc (copper phthalocyanine) or the like is formed on the transparent electrode 11. A light emitting layer 13 made from NPB (4,4'-bis[N-(1-naphthly)-N-phenylamino]biphenyl) or the like is formed on the hole transport layer 12. An electron injection layer 14 made from ALQ (tris(β-hydroxyquinolinato)aluminum) or the like is formed on the light emitting layer 13. A metallic electrode 15 is formed on the electron injection layer 14. The rectifier portion 3 includes the thin organic layer 21, made from NPB or the like, on the metallic electrode 15 of the light emitting portion 2. It should be noted that the electrode 15 below the organic layer (film) 21 serves as an electrode of the rectifier portion 2. The aluminum electrode (thin metallic film) 22 is formed on the organic layer 21. Therefore, the rectifier portion 3 is an organic, thin layer diode. The layers 12 to 15$a$ may extend over the rectifier portion 3.

Figure 3:
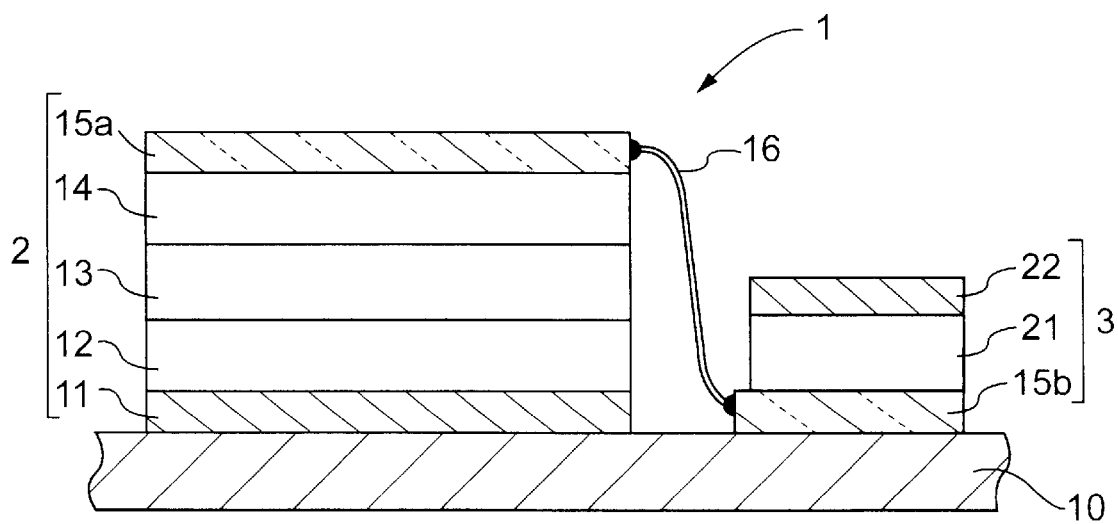
FIG. 3 illustrates a cross sectional view of an organic EL element according to another embodiment of the present invention.

It should be noted that the light emitting element 1 may have the light emitting portion 2 and rectifier portion 3 separately as illustrated in FIG. 3. For example, the rectifier portion 3 may be directly formed on the glass substrate 10. In this arrangement, a metallic electrode 15$a$ in the light emitting portion 2 is connected to a metallic electrode 15$b$ in the rectifier portion 3 by an electrically conductive element such as a lead 16.

Each of the light emitting portion 2 and rectifier portion 3 has its own electrostatic capacity.

Figure 4:
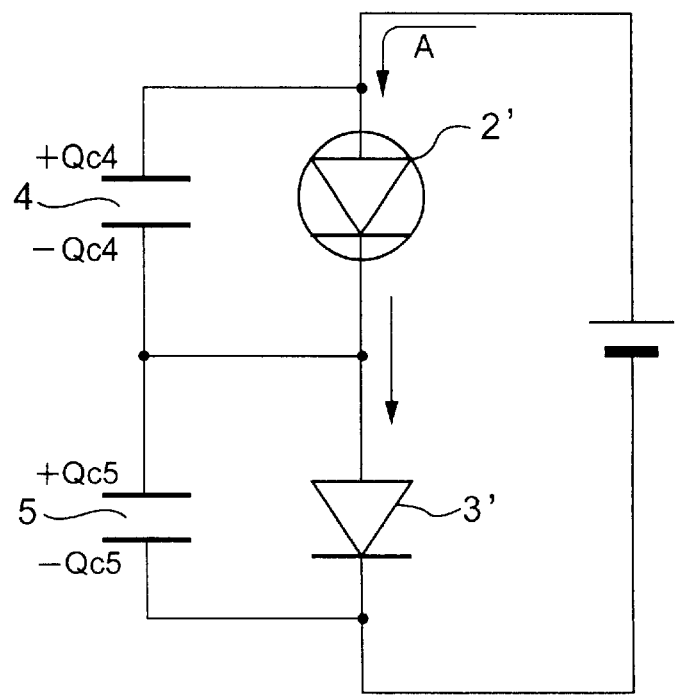
FIG. 4 illustrates an electrically equivalent circuit of the organic EL element of the invention during a light emitting process operation.

Referring to FIG. 4, illustrated is an electrically equivalent circuit of the organic EL element on the organic EL panel shown in FIG. 1. This circuit includes a net light-emitting portion 2' and a net rectifier portion 3' connected in series to the net light-emitting portion 2'. The net light-emitting portion 2' has a capacitor 4 and the net rectifier portion 3' has a capacitor 5.

As shown in FIG. 4, a current flows in the direction A during a light emitting process. As a result, the current flows to the net light emitting part 2' to emit a light, and electric charges Qc4 and Qc5 (steady state) are accumulated in the capacitors 4 and 5 respectively.

Figure 5:
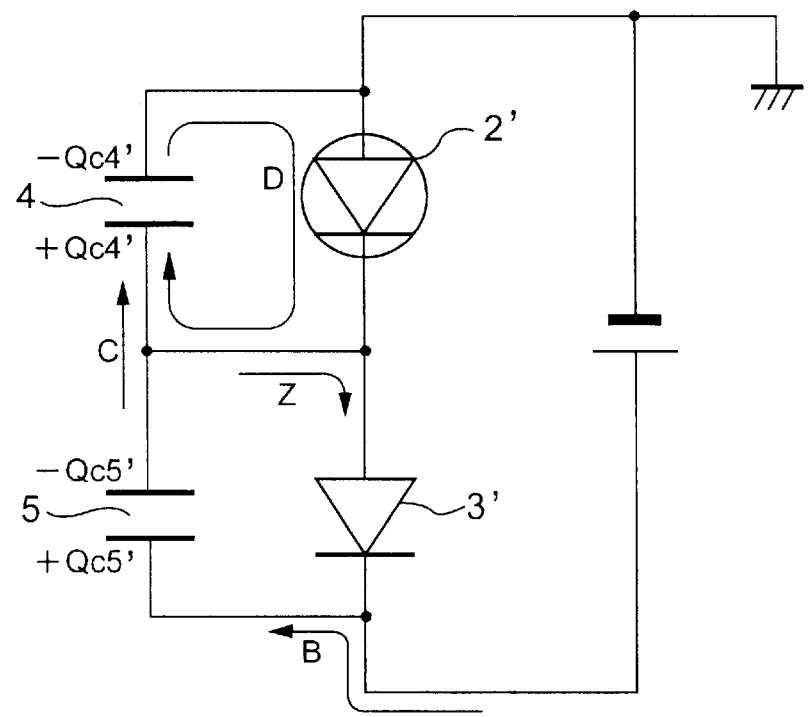
FIG. 5 illustrates an electrically equivalent circuit of the organic EL element after the light emitting process operation.

Referring to FIG. 5, when the polarity of the power source is reversed subsequent to the light emitting process, the electric charges Qc4 and Qc5 in the capacitors 4 and 4 are discharged in the circuit. It should be assumed here that electric charges of the capacitors 4 and 4 will become Qc4' and Qc5' when a steady state is reached after the electric charges are discharged in the circuit. The electric charge Qc4 stored in the capacitor 4 cannot flow to the power source through the rectifier part 3' in the direction Z (valve function of the rectifier 3'). On the other hand, the electric charge can flow into the capacitor 5 from the power source in the direction B. When the electric charge Q (=Qc5'+Qc5) flows into the capacitor 5 from the power source and the electric charge of the capacitor 5 becomes Qc5', i.e., the capacitor 5 reaches a steady state, an electric charge Q flows in the direction C. Therefore, an electric charge of +Qc4'+Qc4−Q (=Q') flows in the direction D. In other words, even if the polarity of the power source is reversed, the electric charge moves in the direction D for a certain period (until the electric charge of the capacitor 4 becomes the value Qc4') so that the light emitting element continuously keeps emitting a light for a while (i.e., residual light emission). As understood from the equation of Q', the electric charge Q that flows from the power source in the direction B reduces the electric charge Q' that is used for the light emission after the polarity reversal. It is therefore desired that the electric charge Q is as small as possible relative to the electric charge Qc4, in order to effectively obtain the residual light emission (light emission after the polarity reversal of the power source). Incidentally, the electric charge Q is proportional to the electrostatic capacity Cd of the capacitor 5, and the electric charge Qc4 is proportional to the electrostatic capacity Cel of the capacitor 4. In order to have the electric charge Q smaller than the electric charge Qc4, consequently, the electrostatic capacity Cd of the capacitor 5 is desired to be smaller than the electrostatic capacity Cel of the capacitor 4. Significant residual light emission can be obtained after the power source polarity reversal if the electrostatic capacity of Cd is equal to or less than a half of the electrostatic capacity Cel.

Referring back to FIGS. 2 and 3, the electrostatic capacity of the capacitor 4 becomes larger than the electrostatic capacity of the capacitor 5 if (1) areas of the opposed electrodes 22 and 15 (or 22 and 15$b$) of the rectifier part 3 become smaller, (2) the distance between the opposed electrodes of the rectifier part 3 becomes larger, or (3) the thin layer 21 of the rectifier part 3 is made from a material having a low dielectric constant (low permittivity).

Now, a method of fabricating the organic EL panel including the light emitting elements of the invention will be described.

Figure 6:
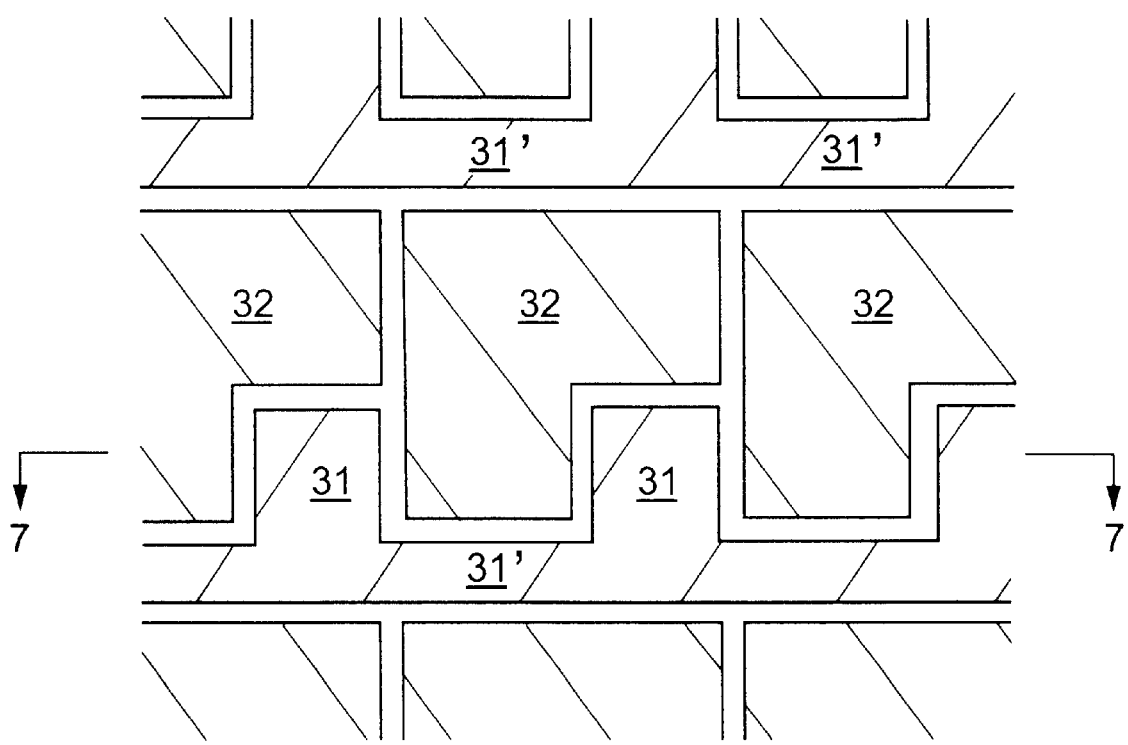
FIG. 6 illustrates a first step of a method of fabricating the organic EL panel of the present invention, and it is a plan view of a substrate of the organic EL panel when ITO electrodes are formed on the substrate.
Figure 7:
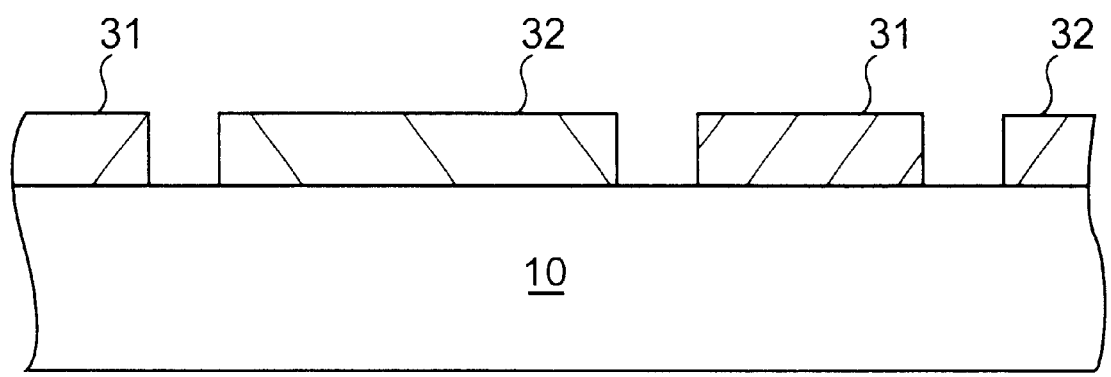
FIG. 7 illustrates a cross sectional view of the organic EL panel shown in FIG. 6 taken along the line 7—7.

Referring to FIGS. 6 and 7, the transparent electrodes 11 and 15$b$ (FIG. 3) made from a light transmissive ITO are formed on the transparent glass substrate 10 by vapor deposition of a pattern. Specifically, an electrode pattern for first electrodes 31 and second electrodes 32 is formed on the substrate 10 by vapor deposition. The rectifier parts will be formed on the first electrodes 31 and the light emitting parts will be formed on the second electrodes 32.

The area of each of the first electrodes 31, on which the rectifier parts, i.e., the organic thin layer diodes, are formed, is preferably made small in order for the rectifier parts to have a small capacitance. However, the valve function of the rectifier part should be ensured so that the first electrodes 31 should have a certain size. The second electrodes 32 are arranged like islands and electrically independent from each other whereas the first electrodes 31 are electrically connected to adjacent first electrodes by electrode connectors 31'. The electric connectors 31' are preferably made from a metallic material having better electrical conductivity than ITO because such electric connectors 31' can reduce an electrical resistance of the ultimately obtained EL panel.

Figure 8:
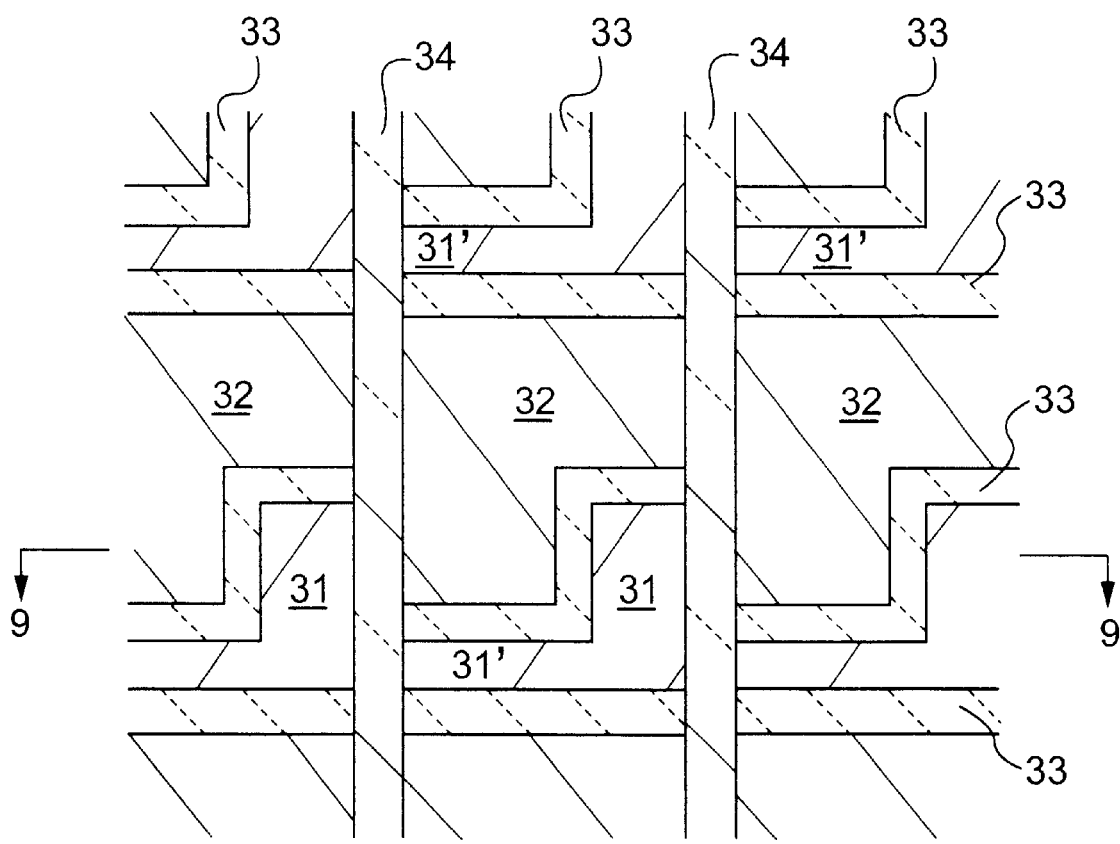
FIG. 8 illustrates a second step of the method of fabricating the organic EL panel of the present invention, and it is a plan view after insulation layers and cathode partition walls are formed.
Figure 9:
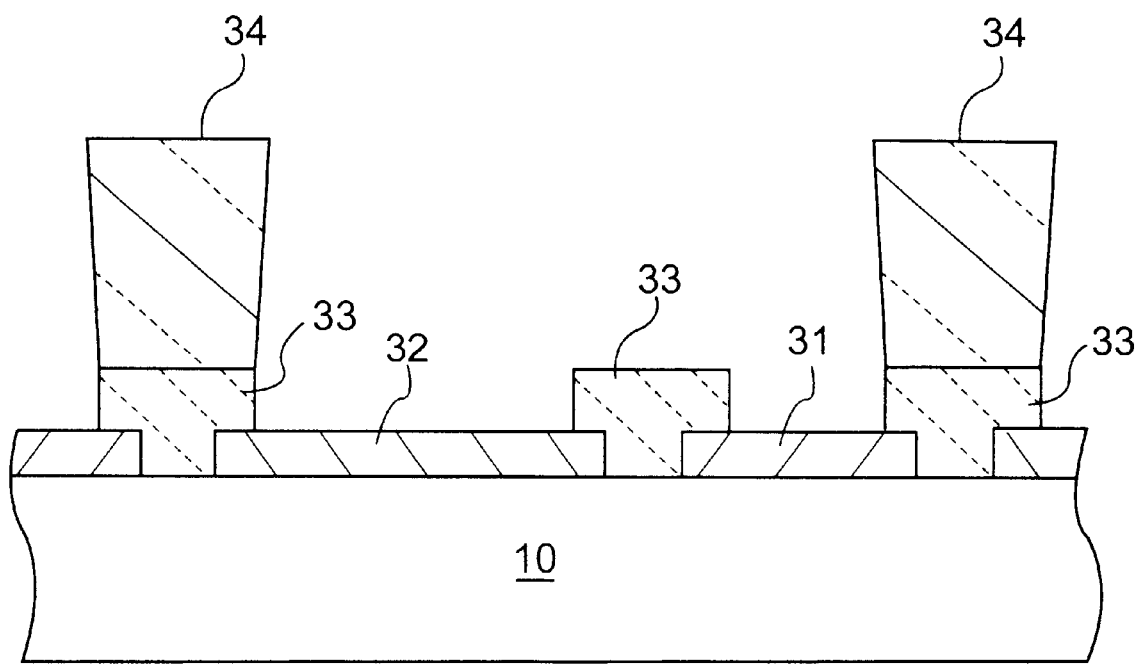
FIG. 9 illustrates a cross sectional view of the organic EL panel shown in FIG. 8 taken along the line 9—9.

Referring to FIGS. 8 and 9, insulation layers 33 are then formed between the first and second electrodes 31 and 32 by applying an insulative resin such as polyimide. Cathode partition walls 34 made from an insulative material are next formed on the insulation layers 33 in such a way that the cathode partition walls 34 only extends in directions perpendicular to the elongated direction of the electrode connectors 31'.

Figure 10:
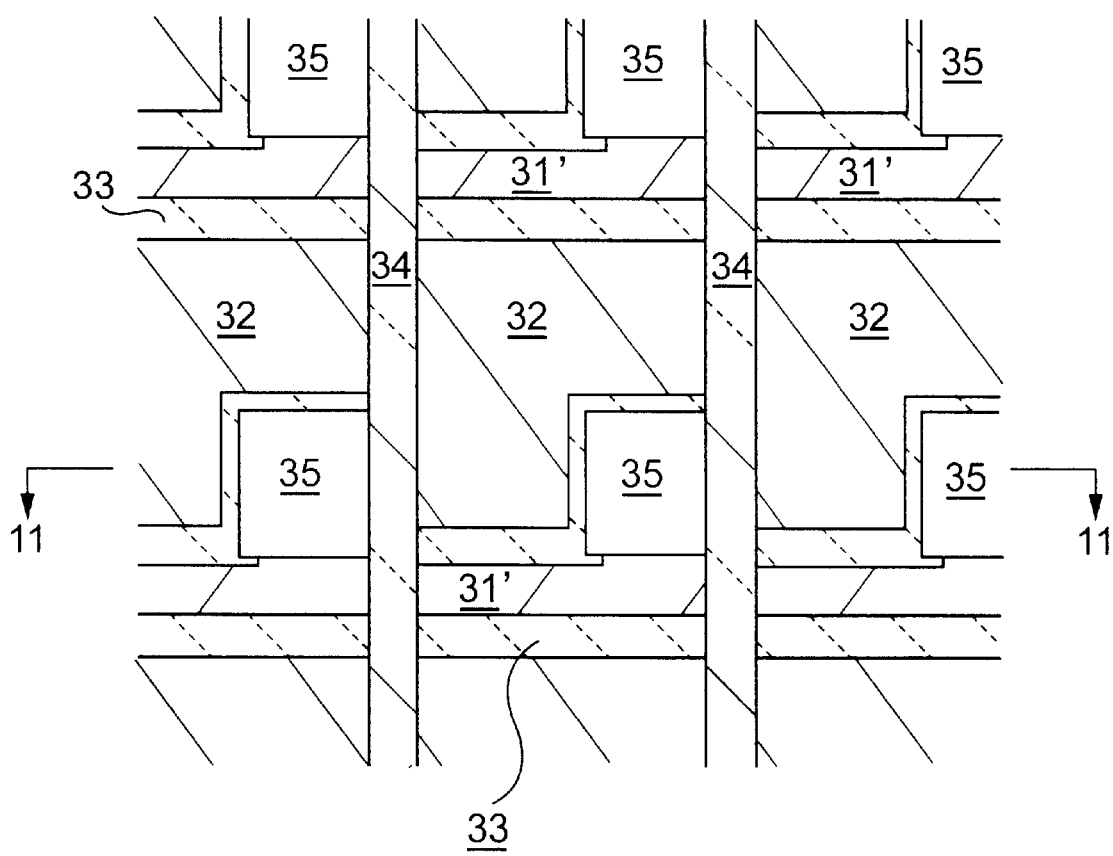
FIG. 10 illustrates a third step of the method of fabricating the organic EL panel of the present invention, and it is a plan view of after organic thin layer diodes are formed.
Figure 11:
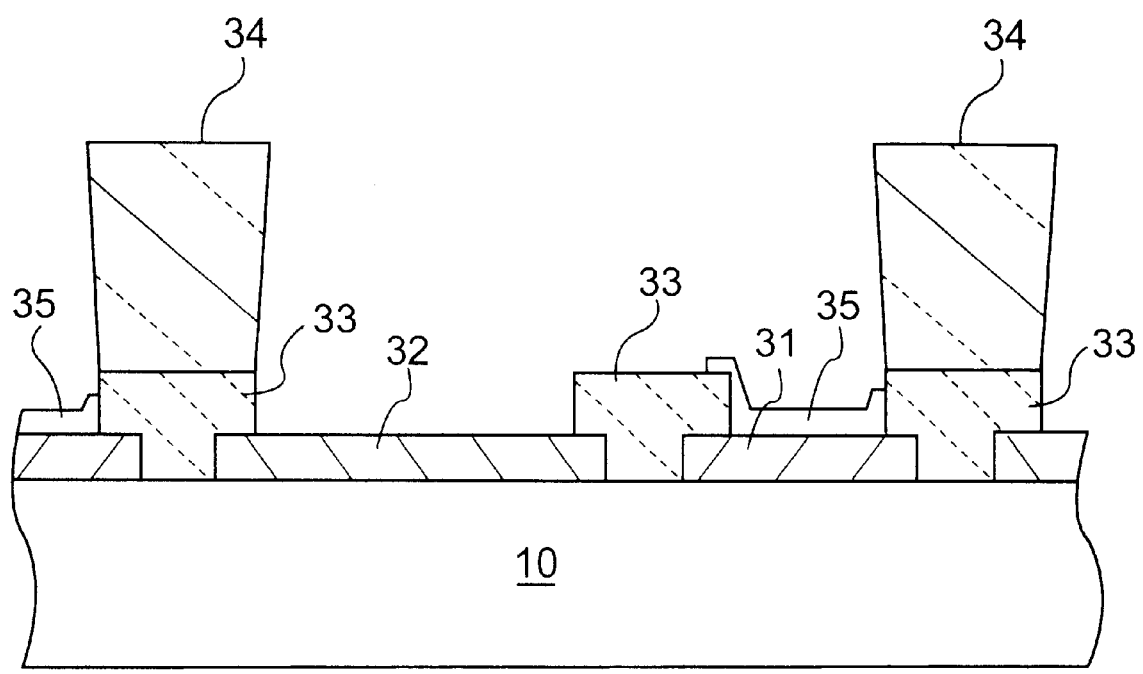
FIG. 11 illustrates a cross sectional view of the organic EL panel shown in FIG. 10 taken along the line 11—11.

After that, as shown in FIGS. 10 and 11, organic thin layer diodes 35 made from, for example, NPB are formed on the first electrodes 31 using a shadow mask (not shown).

Figure 12:
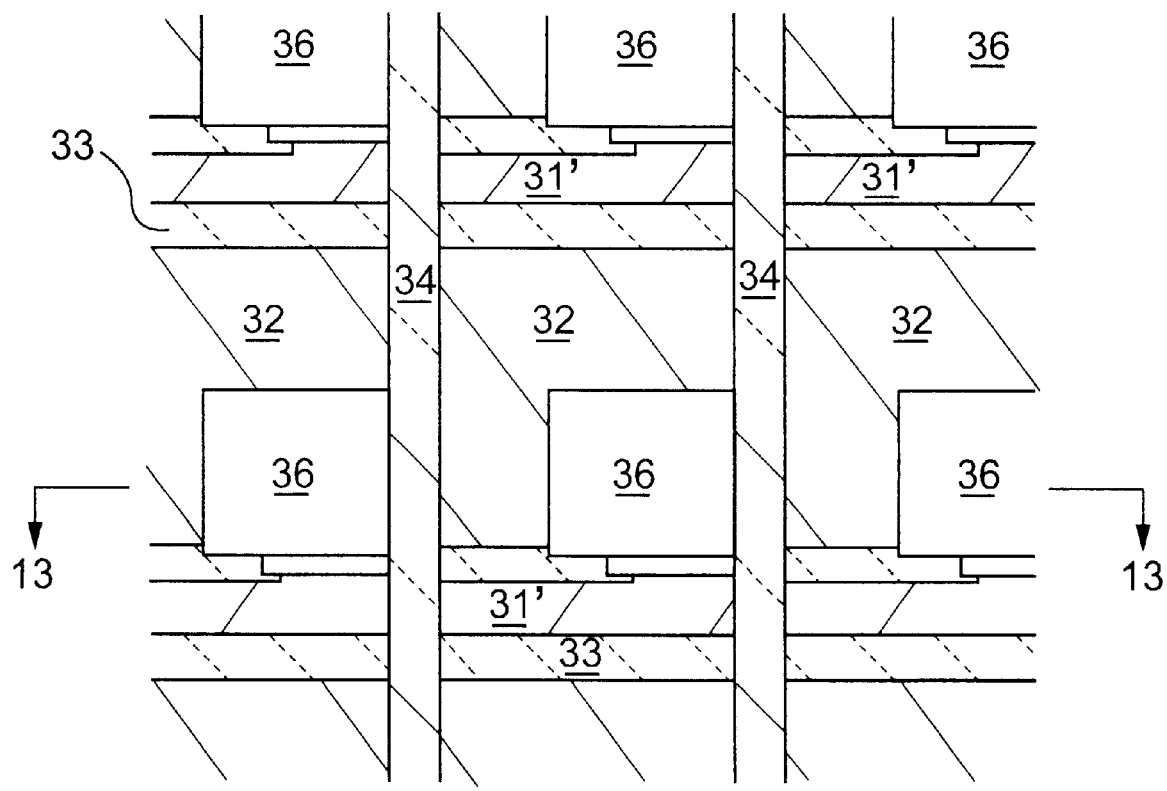
FIG. 12 illustrates-a fourth step of the method of fabricating the organic EL panel of the present invention, and it is a plan view after lead electrodes are formed.
Figure 13:
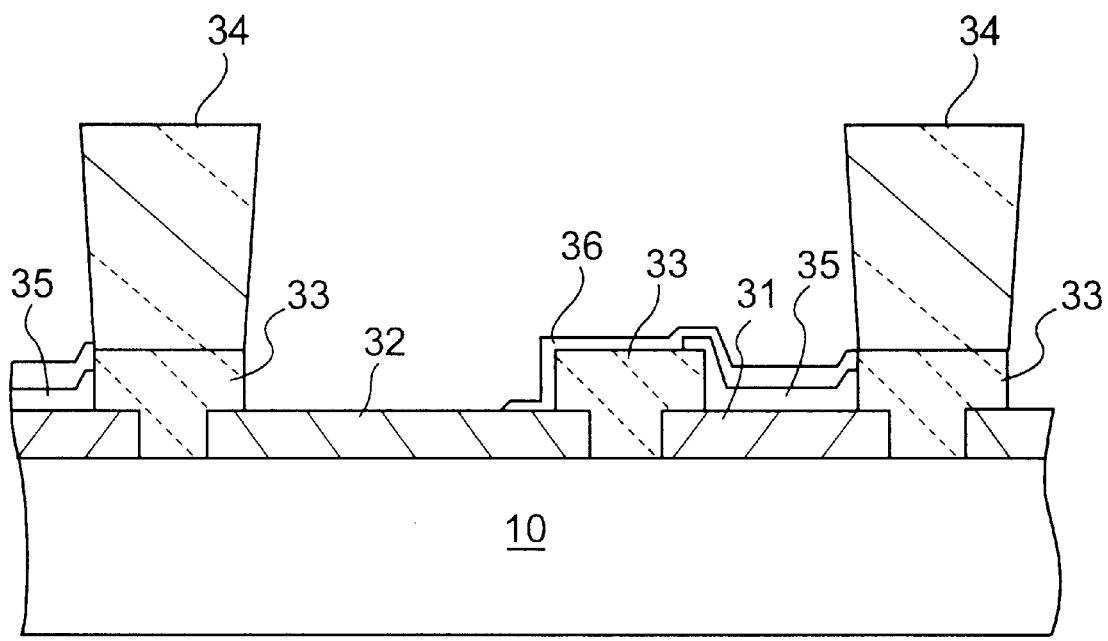
FIG. 13 illustrates a cross sectional view of the organic EL panel shown in FIG. 12 taken along the line 13—13.

Subsequently, as shown in FIGS. 12 and 13, lead electrodes 36 are formed in the form of covering layer over the organic thin layer diodes 35, insulation layers 33 and part of the second electrodes 32 using a shadow mask (not shown). The lead electrodes 36 are electrodes for the organic thin layer diodes 35 and electrically connect the diodes 35 with the second electrodes 32. Preferably each of the lead electrodes 36 includes two layers. The lower layer of each lead electrode 36 is made from Li2O+Al and the upper layer is a transparent conductive layer (e.g., ITO). The lower layer has a thickness of 100 to 200 angstroms and a high work function. The upper layer has a thickness of several hundreds of angstroms and a high work function.

Figure 14:
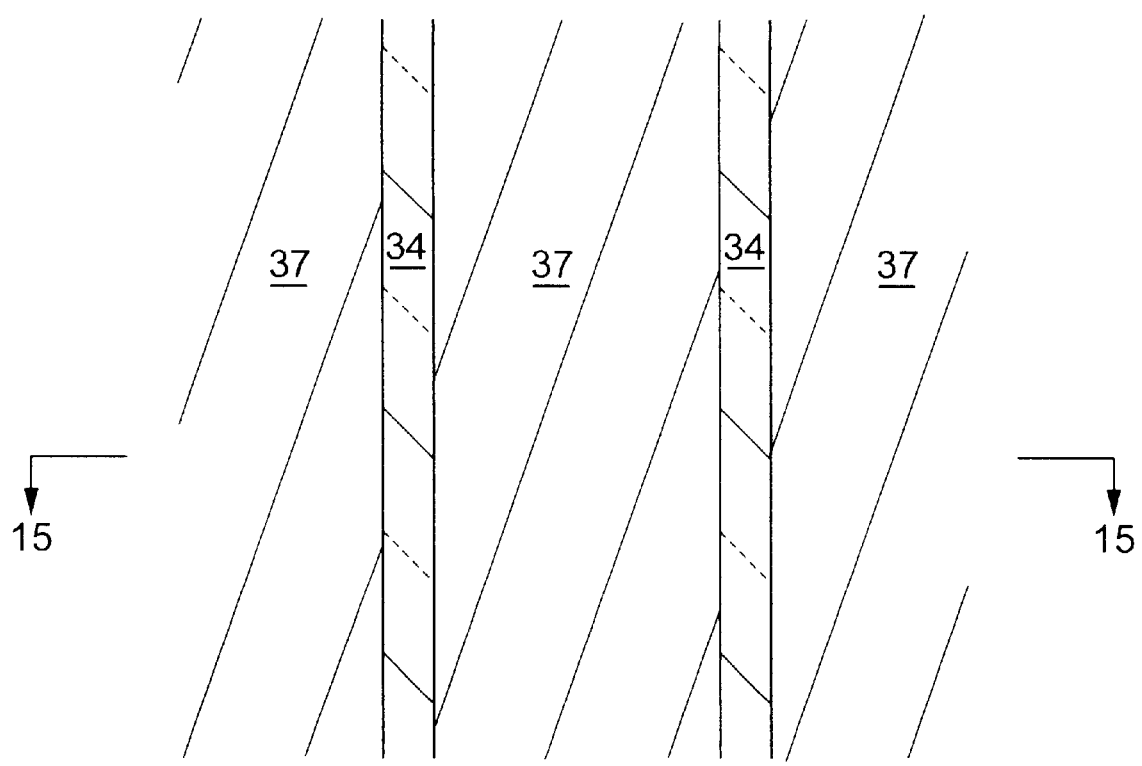
FIG. 14 illustrates a fifth step of the method of fabricating the organic EL panel of the present invention, and it is a plan view after an organic EL multi-layer bodies are formed.
Figure 15:
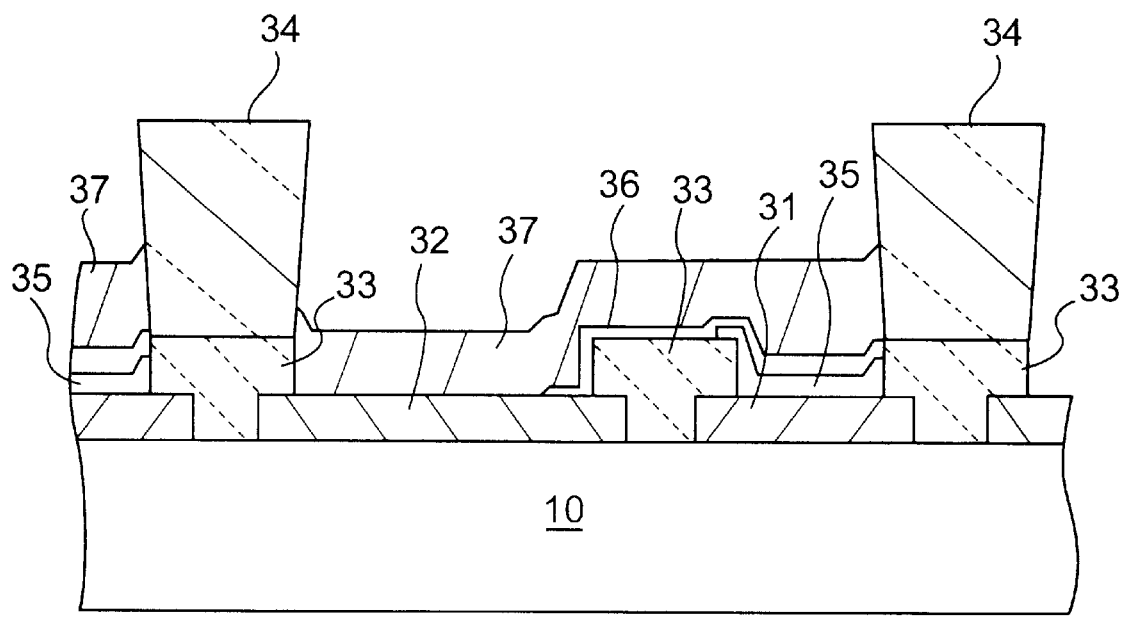
FIG. 15 illustrates a cross sectional view of the organic EL panel shown in FIG. 14 taken along the line 15—15.

Finally, as shown in FIGS. 14 and 15, organic EL multi-layer bodies 37 are formed between the cathode partition walls 34. Each of the organic EL multi-layer bodies 37 includes a hole transport layer, light emitting layer, electron injection layer and metallic electrode. In this manner, an organic EL panel is fabricated.

Preferably, the lead electrodes 36 are sufficiently thin to cause the light generated in the organic EL multi-layer bodies 37 to transmit through the diodes 35 and electrodes 36 and reach the glass substrate 10. If the light reaches the glass substrate 10, the light emission also occurs from the first electrodes 31 of the organic EL panel.

It should be noted that the organic EL multi-layer body 37 may be replaced by an organic EL single-layer body.

As described above, the organic EL element of the present invention has the light emitting part and rectifier part connected in series to the light emitting part, and the electrostatic capacity Cd of the rectifier part is smaller than the electrostatic capacity Cel of the light emitting part. It is therefore possible to increase the total light emitting period during one scanning by an amount of residual light emission caused by the discharging of the electric charge from the capacitor. Accordingly, even if the instantaneous brightness (luminance) of the EL element is reduced, the light emission with sufficient brightness is obtained as a whole. By reducing the instantaneous brightness of the EL element, the deterioration of the light emitting part is suppressed and the life of the light emitting panel is elongated.

The instant application is based on Japanese Patent Application No. 2000-347996, and the entire disclosure thereof is incorporated herein by reference.

What is claimed is:

1. An organic electroluminescence element comprising:
   a single light emitting part having an organic thin layer; and
   a single rectifier part connected in series to the light emitting part, wherein the rectifier part has an organic thin layer, and an electrostatic capacity of the rectifier part is smaller than an electrostatic capacity of the light emitting part.

2. The organic electroluminescence element according to claim 1, wherein the electrostatic capacity of the rectifier part is equal to or smaller than a half of the electrostatic capacity of the light emitting part.

3. The organic electroluminescence element according to claim 1, wherein the rectifier part is formed over the light emitting part.

4. The organic electroluminescence element according to claim 3, wherein the rectifier part is formed over part of the light emitting part.

5. The organic electroluminescence element according to claim 4, wherein the rectifier part is located between the light emitting part and a light emitting surface of the organic electroluminescence element so that a light emitted from the light emitting part reaches the rectifier part before reaching the light emitting surface of the organic electroluminescence element.

6. The organic electroluminescence element according to claim 5, wherein the rectifier part transmits the light emitted from the light emitting part.

7. The organic electroluminescence element according to claim 3, wherein the light emitting part includes a first electrode, a hole transport layer formed on the first electrode, a light emitting layer formed on the hole transport layer, an electron injection layer formed on the light emitting layer and a second electrode formed on the electron injection layer, and the rectifier part includes the second electrode of the light emitting part as its lower electrode, an organic layer formed on the lower electrode, and an upper electrode formed on the organic layer.

8. The organic electroluminescence element according to claim 1, wherein the light emitting part includes a transparent electrode, a hole transport layer formed on the transparent electrode, a light emitting layer formed on the hole transport layer, an electron injection layer formed on the light emitting layer, and a metal electrode formed on the electron injection layer.

9. The organic electroluminescence element according to claim 1, wherein the rectifier part includes a first metal electrode, an organic layer formed on the first metal electrode, and a second metal electrode formed on the organic layer.

10. A method of fabricating an organic electroluminescence element comprising the steps of:
    forming first and second electrodes independently;
    forming an organic thin layer diode on the first electrode;
    forming a lead electrode over the whole of the organic thin layer diode and over at least part of the second electrode; and
    forming an organic electroluminescence body over the second electrode and lead electrode, the organic electroluminescence body having a layer structure and including at least one organic electroluminescence light emitting layer.

11. The method according to claim 10, wherein an electrostatic capacity of the organic thin layer diode is smaller than an electrostatic capacity of the organic electroluminescence body.

12. The method according to claim 11, wherein the electrostatic capacity of the organic thin layer diode is equal to or smaller than half of the electrostatic capacity of the organic electroluminescence body.

13. The method according to claim 10, wherein the organic thin layer diode and lead electrode can transmit a light.

* * * * *

UNITED STATES PATENT AND TRADEMARK OFFICE
CERTIFICATE OF CORRECTION

PATENT NO. : 6,720,735 B2
DATED : April 13, 2004
INVENTOR(S) : Yoshiyuki Okuda, Masami Tsuchida and Satoshi Miyaguchi It is certified that error appears in the above-identified patent and that said Letters Patent is hereby corrected as shown below:

Claim 1, should read:
-- 1. An organic electroluminescence element comprising:
a single light emitting part having an organic thin layer; and
a single rectifier part connected in series to the light emitting part, wherein the rectifier part has an organic thin layer, and an electrostatic capacitance of the rectifier part is smaller than an electrostatic capacitance of the light emitting part. --

Claim 2, should read:
-- 2. The organic electroluminescence element according to claim 1, wherein the electrostatic capacitance of the rectifier part is equal to or smaller than a half of the electrostatic capacitance of the light emitting part. --

Claim 8, should read:
-- 8. The method according to claim 7, wherein an electrostatic capacitance of the organic thin layer diode is smaller than an electrostatic capacitance of the organic electroluminescence body. --

Claim 9, should read:
-- 9. The method according to claim 8, wherein the electrostatic capacitance of the organic thin layer diode is equal to or smaller than half of the electrostatic capacitance of the organic electroluminescence body. --

Signed and Sealed this

First Day of March, 2005

JON W. DUDAS
*Director of the United States Patent and Trademark Office*